(12) United States Patent
Dadvand

(10) Patent No.: US 10,957,637 B2
(45) Date of Patent: Mar. 23, 2021

(54) QUAD FLAT NO-LEAD PACKAGE WITH WETTABLE FLANGES

(71) Applicant: Texas Instruments Incorporated, Dallas, TX (US)

(72) Inventor: Nazila Dadvand, Richardson, TX (US)

(73) Assignee: TEXAS INSTRUMENTS INCORPORATED, Dallas, TX (US)

(*) Notice: Subject to any disclaimer, the term of this patent is extended or adjusted under 35 U.S.C. 154(b) by 0 days.

(21) Appl. No.: 16/239,400

(22) Filed: Jan. 3, 2019

(65) Prior Publication Data

US 2020/0219801 A1    Jul. 9, 2020

(51) Int. Cl.
| | |
|---|---|
| H01L 23/495 | (2006.01) |
| H01L 23/28 | (2006.01) |
| H05K 3/34 | (2006.01) |
| H01L 23/00 | (2006.01) |
| H01L 23/532 | (2006.01) |

(52) U.S. Cl.
CPC ........ *H01L 23/49582* (2013.01); *H01L 23/28* (2013.01); *H01L 23/4951* (2013.01); *H01L 23/49541* (2013.01); *H01L 23/49575* (2013.01); *H01L 23/53233* (2013.01); *H01L 24/97* (2013.01); *H05K 3/3442* (2013.01)

(58) Field of Classification Search
None
See application file for complete search history.

(56) References Cited

U.S. PATENT DOCUMENTS

| | | | |
|---|---|---|---|
| 2007/0209834 A1* | 9/2007 | Kuan | H01L 25/105 174/520 |
| 2013/0333934 A1* | 12/2013 | Hurwitz | H01L 23/3677 174/262 |
| 2014/0021465 A1* | 1/2014 | Facchetti | H01L 51/0034 257/43 |
| 2016/0359097 A1* | 12/2016 | Kurihara | H01L 39/2461 |
| 2017/0005058 A1* | 1/2017 | Hurwitz | H01L 24/11 |

* cited by examiner

*Primary Examiner* — Jay C Chang
(74) *Attorney, Agent, or Firm* — Dawn Jos; Charles A. Brill; Frank D. Cimino

(57) ABSTRACT

A device and method for fabrication thereof is provided which results in corrosion resistance of metal flanges of a semiconductor package, such as a quad flat no-lead package (QFN). Using metal electroplating (such as electroplating of nickel (Ni) or nickel alloys on copper flanges of the QFN package), corrosion resistance for the flanges is provided using a process that allows an electric current to reach the entire backside of a substrate to permit electroplating. In addition, the method may be used to directly connect a semiconductor die to the metal substrate of the package.

14 Claims, 6 Drawing Sheets

QUAD FLAT NO-LEAD PACKAGE WITH WETTABLE FLANGES

Current quad flat no-lead packages (QFN) and similar packages, such as small outline no-lead packages, have exposed copper flanges (also, sometimes referred to as "flanks") serving as contact pads (electrodes) to the package die. These copper flanges (flanks) oxidize, after a period of time upon exposure to air, forming copper oxide (CuO). For instance, CuO may form on the flanges of a semiconductor package during storage of the package prior to use in a product. The CuO presents a significant problem as it prevents an electrical connection to the semiconductor product within the semiconductor package.

Based on the foregoing, there is a need in the art for a fabrication method for QFN and similar packages that permits electroplating of flanges during package fabrication.

SUMMARY

A no-lead package semiconductor device, and methods for fabrication therefor are provided. The package includes a metal substrate which has a front side, a backside and four side edges. In one example, the semiconductor die is directly attached to the backside of the metal substrate, through a cavity, by a metal-to-metal connection. A plurality of metal flanges are located on at least two side edges of the backside, each metal flange being separated from an adjacent metal flange by mold compound, the plurality of metal flanges having a surface being covered by tungsten.

BRIEF DESCRIPTION OF THE DRAWINGS

For a more complete understanding of the present disclosure the objects and advantages thereof, reference is now made to the ensuing descriptions taken in connection with the accompanying drawings briefly described as follows.

DETAILED DESCRIPTION

It is often necessary to have a surface, wettable by a bonding material, such as solder, in order to bond a pad, on an integrated circuit (semiconductor) package, to a printed circuit board (PCB). The word "wettable" references the melting of solder on aligned contact pads (electrical contacts) of a package or on a PCB in connection with the solder wetting of contacts and the reflowing thereon to form a permanent connection between the aligned contacts after the solder has cooled. A wettable surface also promotes the formation of solder fillet which may be useful in detecting solder failures. Copper oxide is not wettable towards tin-based solder. Consequently, a corrosion resistant metal electroplating of the copper flanges (areas which may serve as electrical contacts) would be desirable to prevent the formation of copper oxide thereon. Current methods employ immersion tin on exposed copper flanges. However, immersion tin can provide only a thin layer of tin (Sn) on a copper surface (maximum two microns). This thin layer of tin is often consumed during device storage. As a result of tin consumption, there is often no free tin layer left to provide adequate protection against the oxidation of copper.

A fabrication method is provided herein, among other things, wherein a copper surface may be connected to an electrically conductive surface so as to allow the flow of electric current from a power supply in order to electroplate the copper surface.

Until now, it has not been possible to perform metal electroplating, such as electroplating of corrosion-resistant nickel (Ni) or corrosion-resistant Ni alloys, on copper flanges of a QFN package as the copper flanges are electrically isolated by a surrounding insulating material, such as mold compound. The mold compound makes it difficult to electrically connect flanges to a power supply in order to perform metal electroplating.

Figure 1:
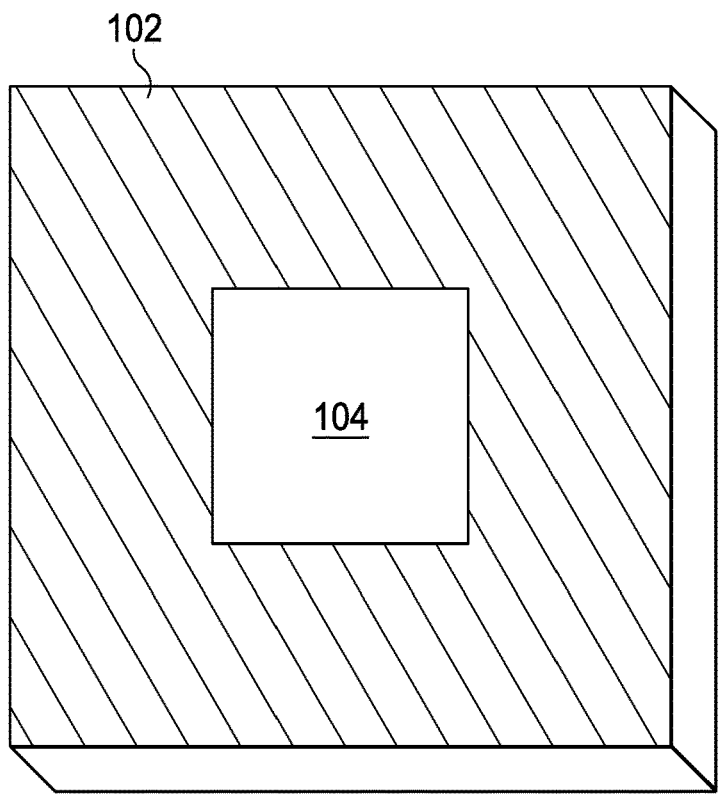
FIG. 1 illustrates a perspective drawing of the backside of a substrate on which a thermally conductive pad lies at the center thereof.

FIG. 1 illustrates a perspective drawing of the backside of substrate 102 having area 104. Area 104 in some examples herein is a cavity extending through substrate 102. Substrate 102 may be part of a metal lead frame, such as a copper (Cu) lead frame. The lead frame serves as the central supporting structure of an integrated circuit (IC) package and a portion of the lead frame is internal to the package. The lead frame is cut apart or singulated during package processing to isolate individual integrated circuit devices into individual IC packages.

Figure 2A:
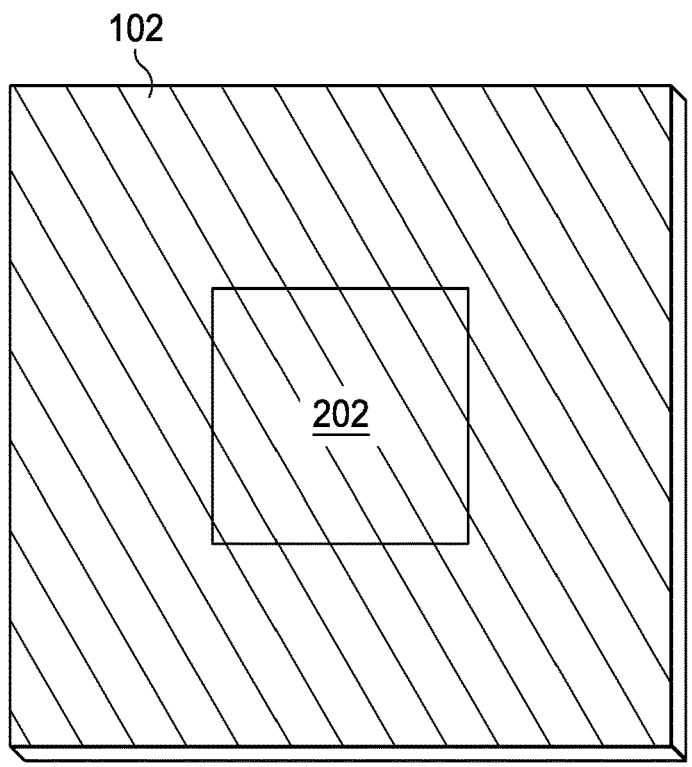
FIG. 2a illustrates a perspective drawing showing the placement of a die on a substrate according to examples presented herein.

The IC package (semiconductor package) includes an integrated circuit (IC) die, a portion of the metal lead frame, bond wires connecting pads on the IC die to individual leads of the lead frame and encapsulating material (e.g., mold compound covering the foregoing and serving as the exterior of the package). FIG. 2a, illustrates a perspective drawing showing an example of the placement of die 202 on substrate 102. In some examples, such placement occurs in connection with die 202 being positioned in area 104 (not shown, with area 104 serving as a cavity) so as to have at least a portion of die 202 emerge on a plane lying parallel to the surface of the backside of substrate 102.

Figure 2B:
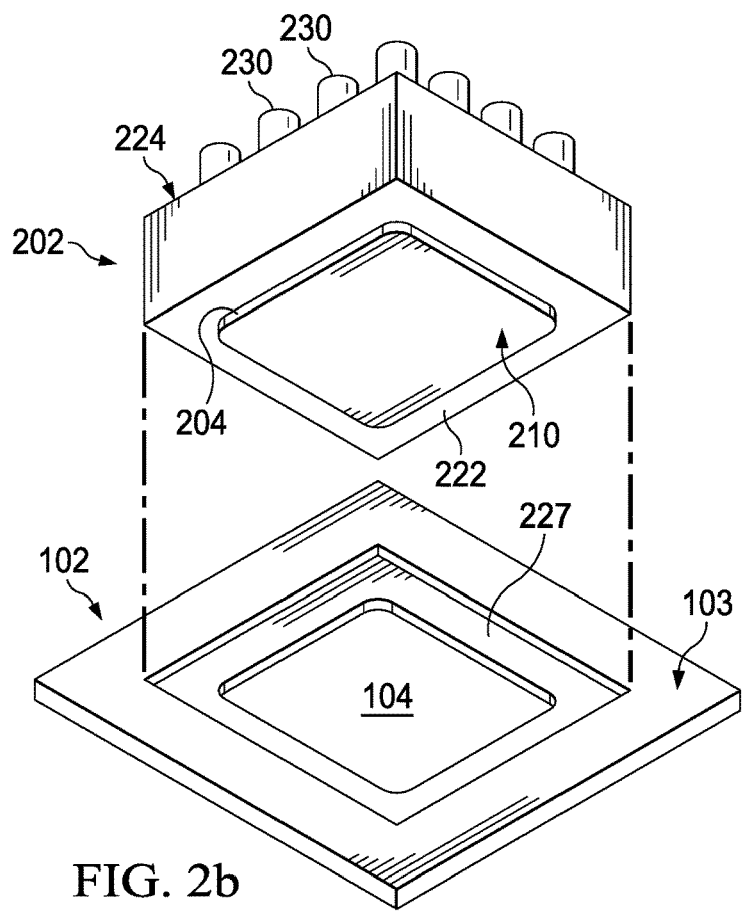
FIG. 2b illustrates a perspective drawing showing a die positioned over a cavity provided straight through the substrate from one side of the substrate to the opposite side of the substrate.

FIG. 2b illustrates a perspective drawing showing die 202 positioned over area 104, which for this example, is a cavity straight through substrate 102 from one side of substrate 102 to the opposite side of substrate 102. Substrate 102 may be part of lead frame 103. Edge 204 around die backside 210 fits snugly through cavity 104 such that die backside 210 emerges through hole 104 on the opposite side of substrate 102. Ledge 222 around the perimeter of die 202 rests on receiving base 227 surrounding area 104 when die 202 is mounted through area 104 so that ledge 222 holds die 202 in place and seals die backside 210 from die front side 224. A number of contact pads 230, are shown on die front side 224, for providing electrical connections to die 202.

With reference again to FIG. 2a, in other examples, die 202 lies on area 104 which may represent a thermally conductive pad which holds die 202 in place on substrate 102. For these thermally conductive pad examples, die 202 may be glued to area 104, to the substrate backside using either a conductive or non-conductive adhesive. In other examples, wherein area 104 serves as a cavity, die 202 emerges through the cavity presented by area 104 and is held in place in a plane on which the substrate backside lies. This may be accomplished through the use of an adhesive tape (not shown) placed over and across the cavity presented by area 104, on the front side of substrate 102. In those examples where area 104 may represent a cavity, such a cavity may be a square cavity serving as a hole in substrate 102. In the examples with die 202 being held in place (such as with an adhesive or adhesive tape (not shown)), the backside of substrate 102 and the backside of die 202 are subjected to a copper bath and electroplated. This results in attachment of die 202 to substrate 102, through copper-to-copper cohesion.

After die 202 is attached to substrate 102, by one of the methods detailed herein, bond pads (not shown) may be connected from die 202 to selected places on the front side (not shown) of substrate 102 where metal contact pads are desired.

Figure 3:
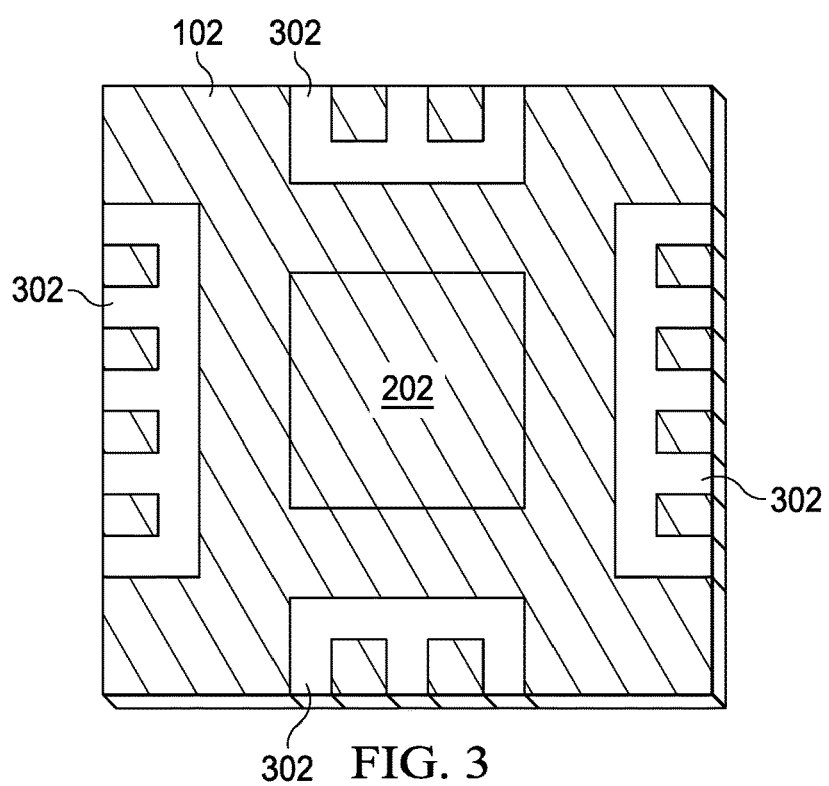
FIG. 3 illustrates a perspective drawing of a resulting structure following a patterned metal etch to expose mold compound.

Mold compound is then placed on the front side of substrate 102. This is followed by the removal of copper, by a metal etch, from portions of the backside of substrate 102, using a patterned metal etch mask, to expose mold compound lying on a plane parallel to the front side of substrate 102. The patterned metal etch may be accomplished by the following: placing light sensitive photoresist on the backside of the substrate; and exposing the photoresist to light from a light source, through a photoresist mask having a pattern. The light causes polymerization of desired areas, in accordance with the pattern. Thereafter, a liquid etch is applied to the substrate backside which selectively removes copper (that copper not protected by polymerization). Thereafter, the polymerized photoresist is removed with a solvent. FIG. 3 illustrates a perspective drawing of the resulting structure showing the exposed mold compound as viewed from a perspective showing the backside of substrate 102. The exposed mold compound pattern that is visible from the backside is collectively referenced as mold compound pattern 302.

Figure 4:
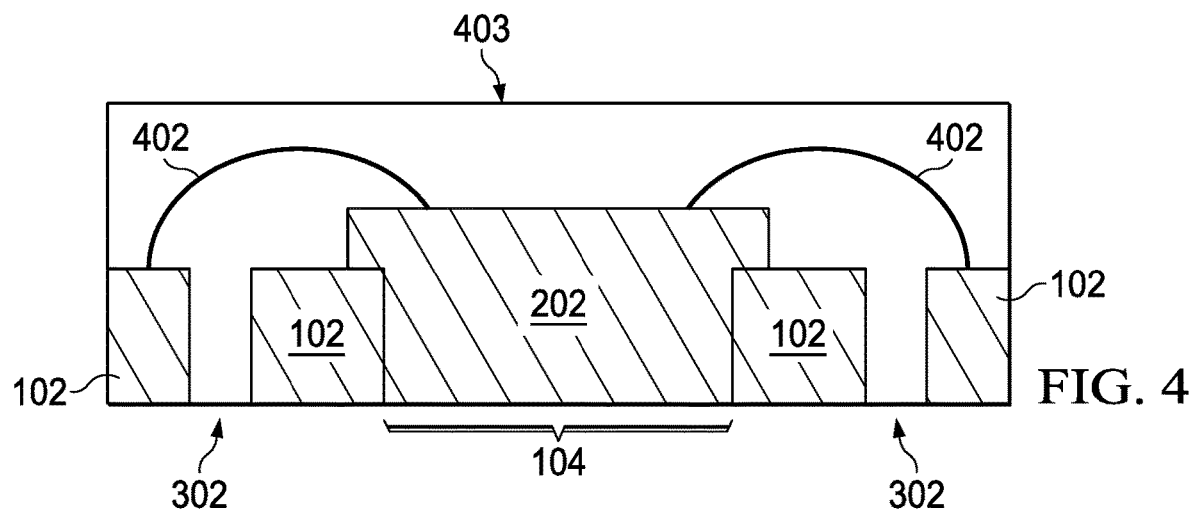
FIG. 4 is a sectional drawing showing some bond wire connections between bond pads and the semiconductor die of the structure shown in FIG. 3.

FIG. 4 is a sectional drawing showing bond wire connection 402, on the substrate front side, between areas intended for metal contact bond pads and die 202 of the structure shown in FIG. 3. After providing bond wire connection, molding compound 403 is then placed overall, as shown, on the substrate front side, resulting in the structure shown in FIG. 4.

Figure 5:
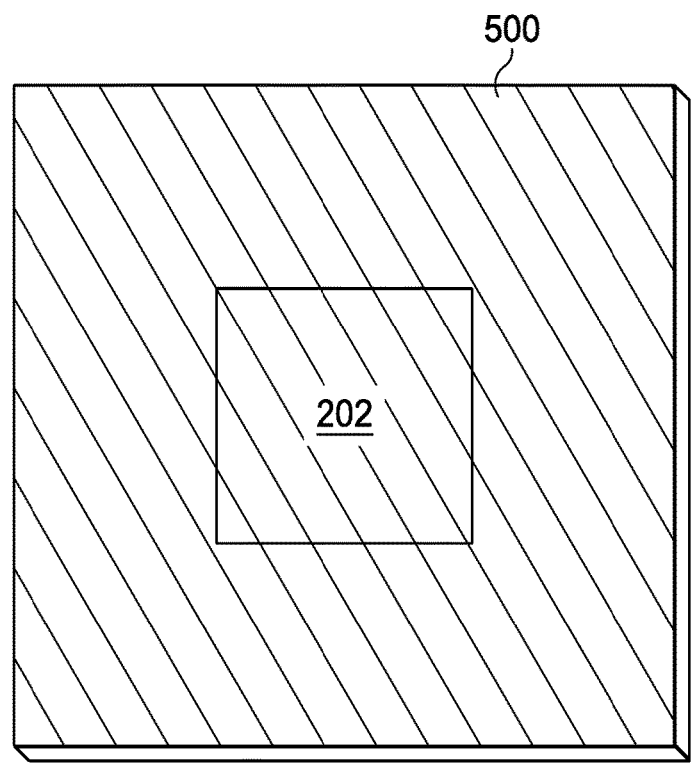
FIG. 5 is a perspective drawing which illustrates a resulting layer of copper on the backside of the substrate following the sputter of copper thereon.

In a further fabrication step, a thin (100-200 nanometers) layer of copper is sputtered, on the backside of substrate 102, sufficient to provide an electrically conductive surface over the backside of substrate 102. FIG. 5 is a perspective drawing which illustrates the resulting layer, copper layer 500, on the backside of substrate 102. A resist pattern, reflective of that of mold compound pattern 302 of FIG. 3, is provided on copper layer 500. The resist pattern may be accomplished by the following: placing light sensitive photoresist on the backside of the substrate; and exposing the photoresist to light from an ultraviolet light source, through a photoresist mask having the desired pattern. The light causes polymerization on desired areas, according to pattern 302, on the substrate backside.

Figure 6:
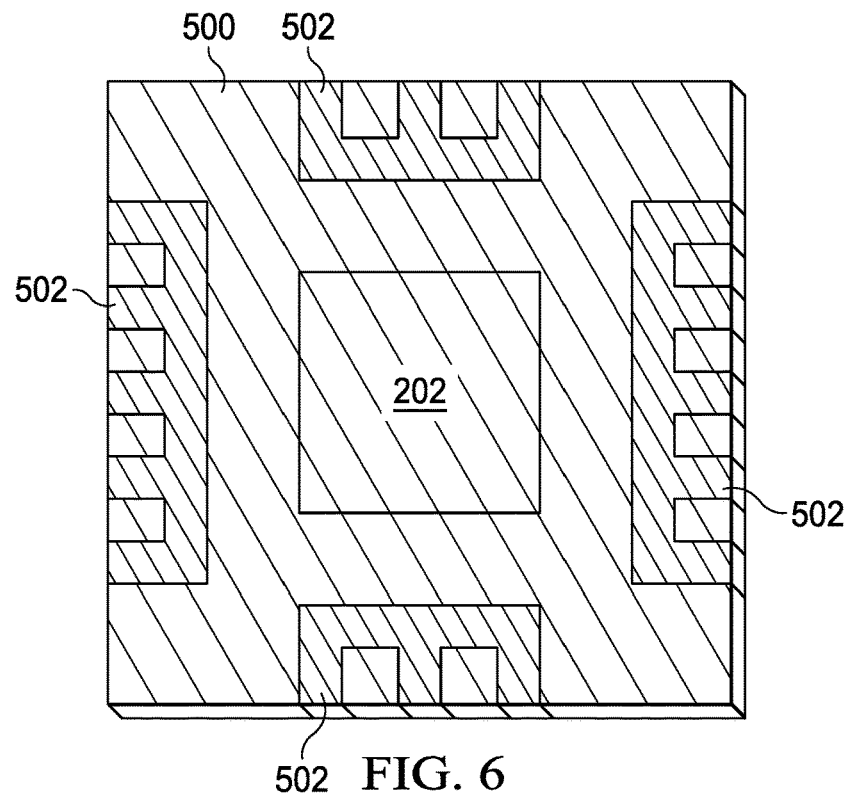
FIG. 6 illustrates a perspective drawing showing protective coating over copper which overlies a mold compound pattern.

FIG. 6 illustrates a perspective drawing of protective coating 502, resulting from polymerized resist, over the copper overlying mold compound pattern 302 of FIG. 3.

Figure 7:
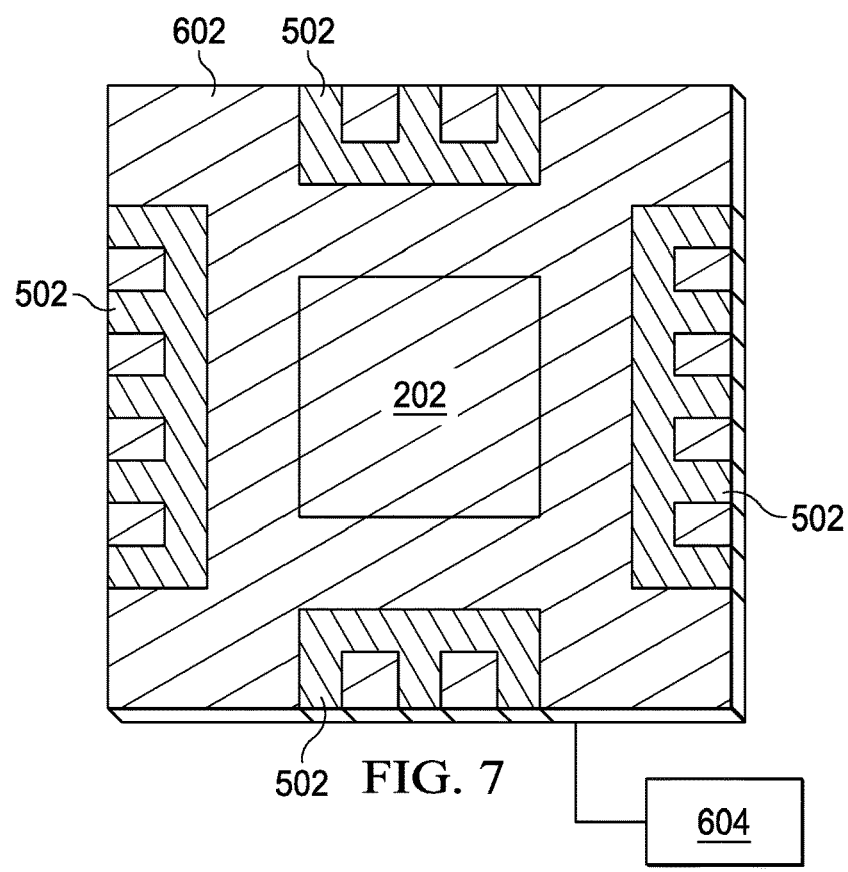
FIG. 7 is a perspective drawing of a corrosion-resistant metal which lies on the backside of the substrate save for the areas covered with the protective coating.

Once protective coating 502 is in place, electro-deposition of a corrosion-resistant metal over the backside of substrate 102 is performed. FIG. 7 shows a perspective drawing of a resulting corrosion-resistant metal 602 which lies on the backside of substrate 102 save for the areas covered with the protective coating. This requires connection of the backside of substrate 102 to an electric current to facilitate the electro-deposition. Reference numeral 604 represents the source of an electric current application to the backside of substrate 102. Although protective coating 502 is not conductive, the underlying copper is conductive, permitting application of an electric current to the substrate backside sufficient to cause coverage of corrosion-resistant metal 602 over areas of substrate 102 enclosed between features, defined by protective coating 502, which will serve as electrical contacts on substrate 102. Among the metals which may be deposited, on the backside, are metals or alloys of metals such as nickel (Ni), nickel tungsten (NiW) and tin (Sn).

Figure 8:
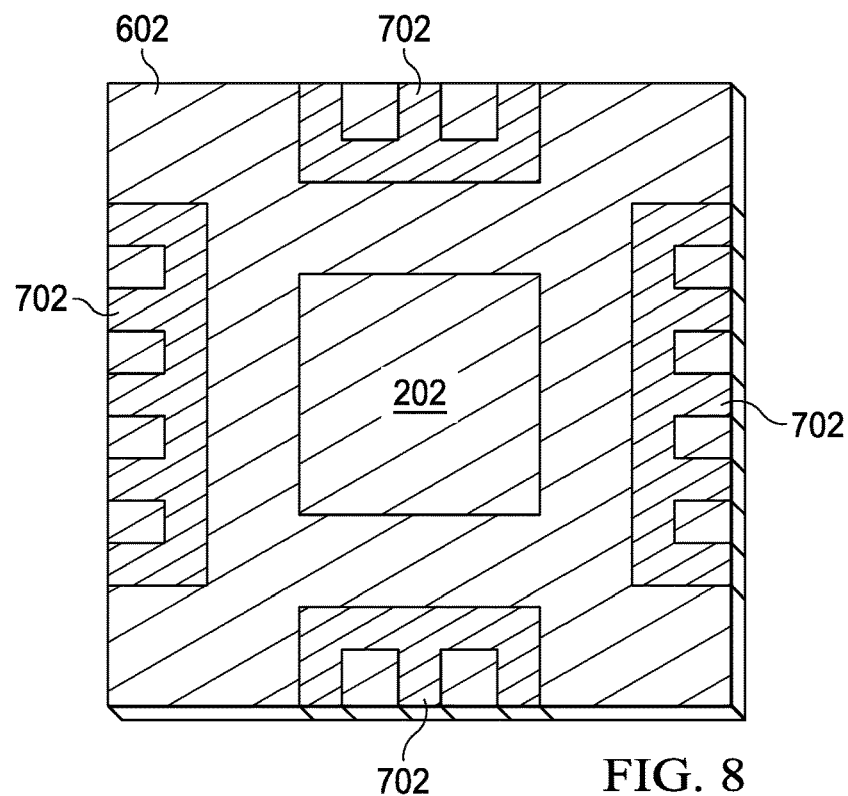
FIG. 8 is a perspective drawing of the resulting backside of the substrate following the removal of a protective coating which exposes copper thereunder.

The foregoing is followed by a photoresist rinse to remove protective coating 502. As shown in FIG. 8, a perspective drawing of the resulting backside of substrate 102, the removal of protective coating 502 exposes copper thereunder as collectively represented by copper patterns 702. Now, areas interspersed in-between the mold compound patterns, which will serve as contacts, are now covered with a corrosion resistant metal.

Figure 9:
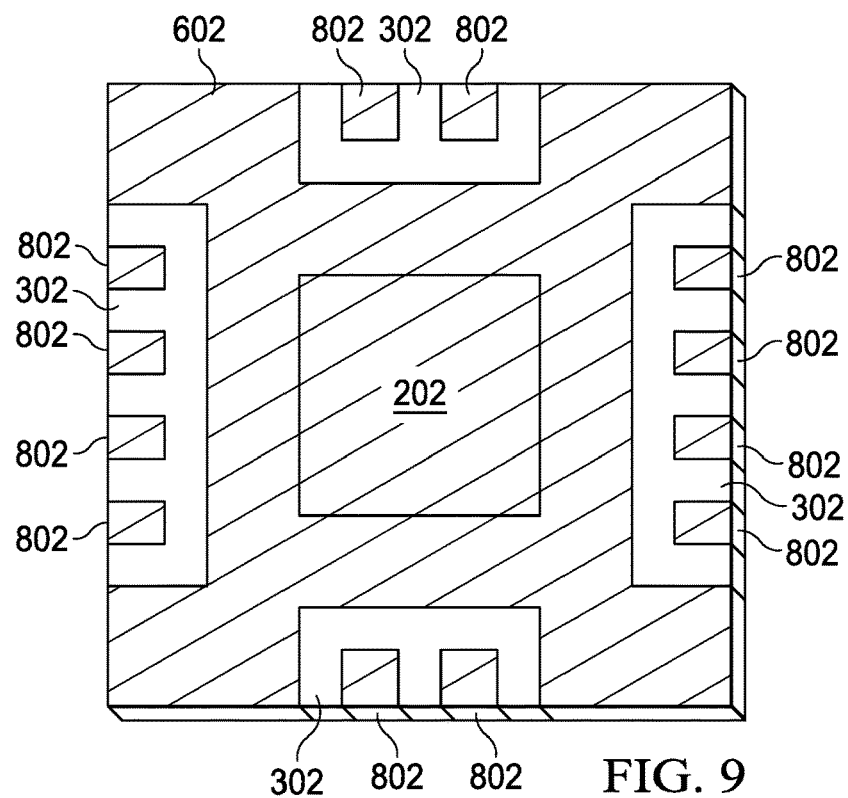
FIG. 9 is a perspective drawing of the resulting structure which leaves corrosion-resistant pad regions which are electrically isolated by mold compound.

The backside of substrate 102 is exposed to a metal etch which is selective to copper (it etches only copper leaving the corrosion resistant metal intact). The patterned metal etch may be accomplished by the following: placing light sensitive photoresist on the backside of the substrate; and exposing the photoresist to ultraviolet light from a light source, through a photoresist mask having a pattern. The light causes polymerization of desired areas, reflecting the pattern, on the substrate backside. Thereafter, a liquid etch is applied to the substrate backside which selectively removes copper (that copper not protected by polymerization). Thereafter, the polymerized photoresist is removed with a solvent. FIG. 9 is a perspective drawing of the resulting structure which leaves corrosion-resistant pad regions, collectively represented as metal flanges 802, which will serve as electrical contacts, electrically isolated by mold compound which is left after the etching away of copper.

Figure 10:
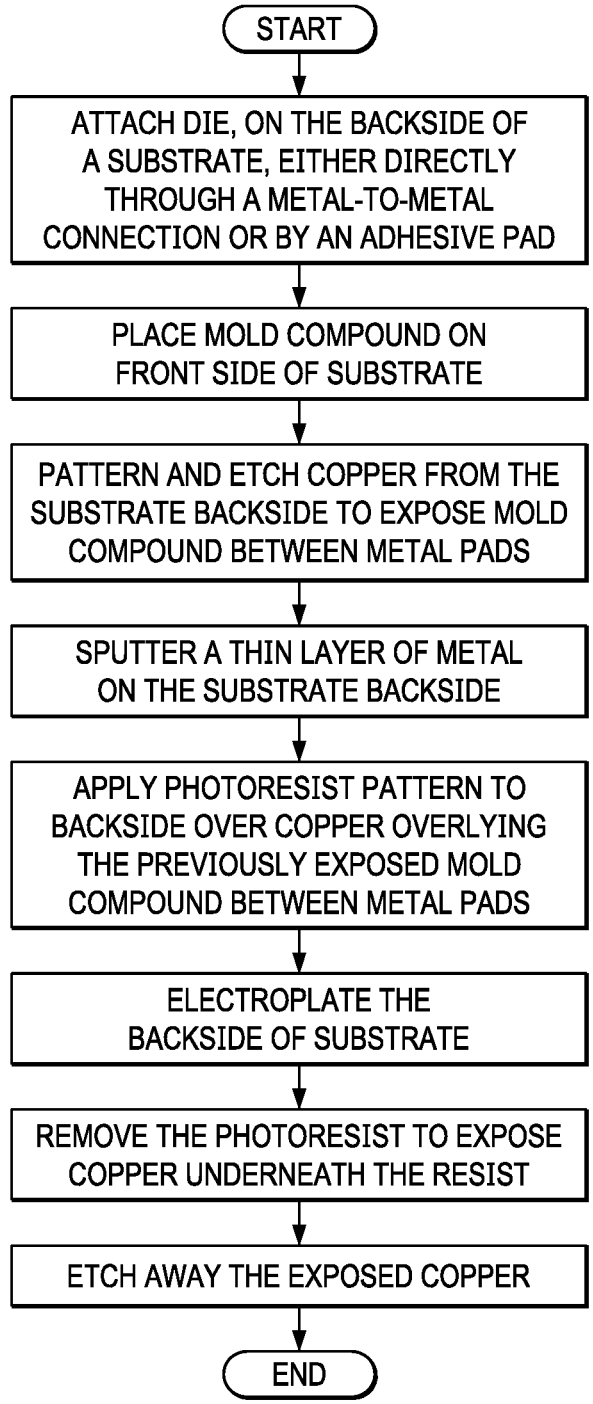
FIG. 10 illustrates a flowchart of the fabrication process.

FIG. 10 illustrates a flowchart of the above fabrication process. With reference to FIG. 10, one embodiment of the foregoing fabrication process proceeds as follows:

(A) attach a die, either through a cavity using a direct metal-to-metal connection or by using a thermally conductive pad, to a substrate;

(B) attach bond wires to bond pad areas of the front side of the substrate, to the die;

(C) place mold compound on the front side of a substrate;

(D) pattern and etch copper from the substrate backside to expose mold compound between metal pads;

(E) sputter a thin layer of copper on the substrate backside;

(F) apply a photoresist pattern to backside of the substrate over copper overlying the previously exposed mold compound between metal pads;

(G) electroplate the backside of the substrate with a corrosion resistant metal or metal alloy;

(H) remove the photoresist to expose the copper underneath the resist; and (I) etch away the exposed copper, leaving patterns of mold compound between corrosion-resistant metal flanges.

For the embodiments herein, wherein the manner of attachment of the semiconductor die 202 is through direct metal-to-metal attachment to substrate 102, thermal conductance has been measured, in some cases, as being ten times greater as compared with a pad attachment achieved through strictly adhesive methods. This presents a highly advantageous technology in addition to the benefits provided by the foregoing methods and structure described herein which result in corrosion resistant contacts.

The foregoing has been described herein using specific embodiments for the purposes of illustration only. It will be readily apparent to one of ordinary skill in the art, however, that the principles herein can be embodied in other ways. Therefore, the foregoing should not be regarded as being limited in scope to the specific embodiments disclosed herein, but instead as being fully commensurate in scope with the following claims.

I claim:

1. A method of making a semiconductor device, comprising:
    attaching a backside of a die, the back side of the die opposite to a side of the die including bond pads, to a backside of a metal substrate including a cavity;
    placing mold compound contacting a front side of the metal substrate;
    patterning and etching metal from the backside of the metal substrate to result in exposed mold compound;
    depositing metal on the backside of the metal substrate and the exposed mold compound;
    providing polymerized photoresist over the metal deposited on the backside of the metal substrate and the exposed mold compound;
    electroplating the backside of the metal substrate with a corrosion resistant metal or metal alloy;
    removing the polymerized photoresist, to expose metal thereunder; and
    etching away exposed metal, wherein the attaching of the backside of the die to the backside of the metal substrate is accomplished in connection with holding the die in place and electroplating the backside of the die and the backside of the substrate, using an electroplating process.

2. The method of making a semiconductor device, as recited in claim 1, wherein the metal substrate is made of copper.

3. The method of making a semiconductor device as recited in claim 1 wherein the metal deposited on the backside of the substrate is sputtered thereon.

4. The method of making a semiconductor device, as recited in claim 3, wherein the metal sputtered on the backside of the substrate is a metal selected from the group consisting of tungsten, nickel tungsten, tin and combinations thereof.

5. The method of making a semiconductor device, as recited in claim 1, wherein the backside of the substrate is electroplated in connection with an electric current being applied thereto.

6. The method of making a semiconductor device, as recited in claim 1, where the semiconductor device is a quad flat no-lead package (QFN).

7. The method of making a semiconductor device, as recited in claim 1, where the semiconductor device is a small outline no-lead package.

8. The method of making a semiconductor device, as recited in claim 1, wherein the corrosion resistant metal or metal alloy includes nickel (Ni), nickel tungsten (NiW) or tin (Sn).

9. The method of making a semiconductor device, as recited in claim 1, where the exposed mold compound is in a pattern from at least one view of the semiconductor device.

10. The method of making a semiconductor device, as recited in claim 9, where providing polymerized photoresist over the metal deposited on the backside of the metal substrate and the exposed mold compound comprises providing polymerized photoresist, according to the pattern defined by the exposed mold compound.

11. The method of making a semiconductor device, as recited in claim 1, where etching away exposed metal leaves patterned mold compound between corrosion-resistant metal flanges.

12. A method of making a semiconductor device comprising:
    attaching a die, to a backside of a copper substrate through direct copper-to-copper cohesion;
    placing mold compound over a front side of the copper substrate;
    patterning and etching copper from the backside of the copper substrate to form a plurality of copper metal pads among exposed mold compound areas;
    depositing copper on the substrate backside, including the exposed mold compound areas;
    providing polymerized photoresist, over deposited copper, according to a pattern as defined by the exposed mold compound areas;
    electroplating the backside of the substrate with a corrosion resistant metal or metal alloy;
    removing the polymerized photoresist to expose the metal thereunder; and
    etching away the exposed metal, leaving patterned mold compound between corrosion-resistant metal flanges.

13. The method of making a semiconductor device, as recited in claim 12, where the metal substrate includes a cavity and the die is in the cavity.

14. The method of making a semiconductor device, as recited in claim 12, where attaching the die includes attaching a side opposite to a side including bond pads to the copper substrate.

* * * * *